(12) United States Patent
Aoki et al.

(10) Patent No.: US 11,481,056 B2
(45) Date of Patent: Oct. 25, 2022

(54) DISPLAY DEVICE

(71) Applicant: Japan Display Inc., Tokyo (JP)

(72) Inventors: Kinichi Aoki, Tokyo (JP); Hiromasa Miyashita, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/215,936

(22) Filed: Mar. 29, 2021

(65) Prior Publication Data

US 2021/0216159 A1 Jul. 15, 2021

Related U.S. Application Data

(63) Continuation of application No. 15/817,993, filed on Nov. 20, 2017, now Pat. No. 10,963,079.

(30) Foreign Application Priority Data

Nov. 29, 2016 (JP) .............................. JP2016-231325

(51) Int. Cl.
| | | |
|---|---|---|
| *G06F 3/00* | (2006.01) | |
| *G06F 3/041* | (2006.01) | |
| *H05K 1/02* | (2006.01) | |
| *G06F 3/044* | (2006.01) | |
| *G02F 1/1333* | (2006.01) | |

(Continued)

(52) U.S. Cl.
CPC ........ *G06F 3/0412* (2013.01); *G02F 1/13338* (2013.01); *G02F 1/133345* (2013.01); *G02F 1/133528* (2013.01); *G06F 3/0443* (2019.05); *G06F 3/0446* (2019.05); *G06F 3/04164* (2019.05); *G06F 3/04166* (2019.05); *H05K 1/0259* (2013.01); *G02F 1/13306* (2013.01); *G02F 2201/122* (2013.01); *G06F 2203/04111* (2013.01); *H05K 2201/10128* (2013.01)

(58) Field of Classification Search
None
See application file for complete search history.

(56) References Cited

U.S. PATENT DOCUMENTS

| 2009/0322704 A1 | 12/2009 | Anno |
|---|---|---|
| 2010/0090972 A1 | 4/2010 | Kuwajima et al. |

(Continued)

FOREIGN PATENT DOCUMENTS

| EP | 2 796 969 | 10/2014 |
|---|---|---|
| JP | 2010-091868 A | 4/2010 |

(Continued)

OTHER PUBLICATIONS

Japanese Office Action dated Mar. 24, 2020 in corresponding Japanese Application No. 2016-231325.

(Continued)

*Primary Examiner* — Michael A Faragalla
(74) *Attorney, Agent, or Firm* — K&L Gates LLP

(57) ABSTRACT

A display device is provided and includes a touch panel including a first substrate, a detection electrode located in a sensor area on the first substrate; an insulating layer covering the detection electrode, a display panel comprising a polarizer opposed to the touch panel; and an insulating material overlapping the detection electrode, contacting the insulation layer and a side surface of the polarizer, and not contacting the detection electrode.

11 Claims, 17 Drawing Sheets

(51) Int. Cl.
*G02F 1/1335* (2006.01)
*G02F 1/133* (2006.01)

(56) References Cited

U.S. PATENT DOCUMENTS

| | | | |
|---|---|---|---|
| 2011/0267551 A1* | 11/2011 | Yokote | G06F 1/1643 |
| | | | 348/836 |
| 2011/0297942 A1* | 12/2011 | Kim | H01L 51/524 |
| | | | 257/59 |
| 2012/0044182 A1 | 2/2012 | Seo et al. | |
| 2015/0009422 A1 | 1/2015 | Tung | |
| 2015/0015803 A1 | 1/2015 | Wang et al. | |
| 2015/0169109 A1* | 6/2015 | Park | G06F 3/0443 |
| | | | 345/174 |
| 2015/0253809 A1 | 9/2015 | Hata et al. | |
| 2016/0283001 A1* | 9/2016 | Xu | G06F 3/0446 |
| 2016/0365367 A1* | 12/2016 | Kimura | G06F 3/0446 |

FOREIGN PATENT DOCUMENTS

| | | |
|---|---|---|
| JP | 2010-091966 A | 4/2010 |
| JP | 2010-169791 | 8/2010 |
| JP | 2010-224081 A | 10/2010 |
| JP | 2010-224380 | 10/2010 |
| JP | 2014-224937 | 12/2014 |
| WO | 2014/069387 | 5/2014 |

OTHER PUBLICATIONS

Japanese Office Action dated Oct. 26, 2021 in corresponding Japanese Application No. 2020-172581.
Chinese Office Action dated Dec. 23, 2021 in corresponding Chinese Application No. 201711211789.5.
Chinese Office Action dated Jun. 10, 2022 in corresponding Chinese Application No. 201711211789.5.

* cited by examiner

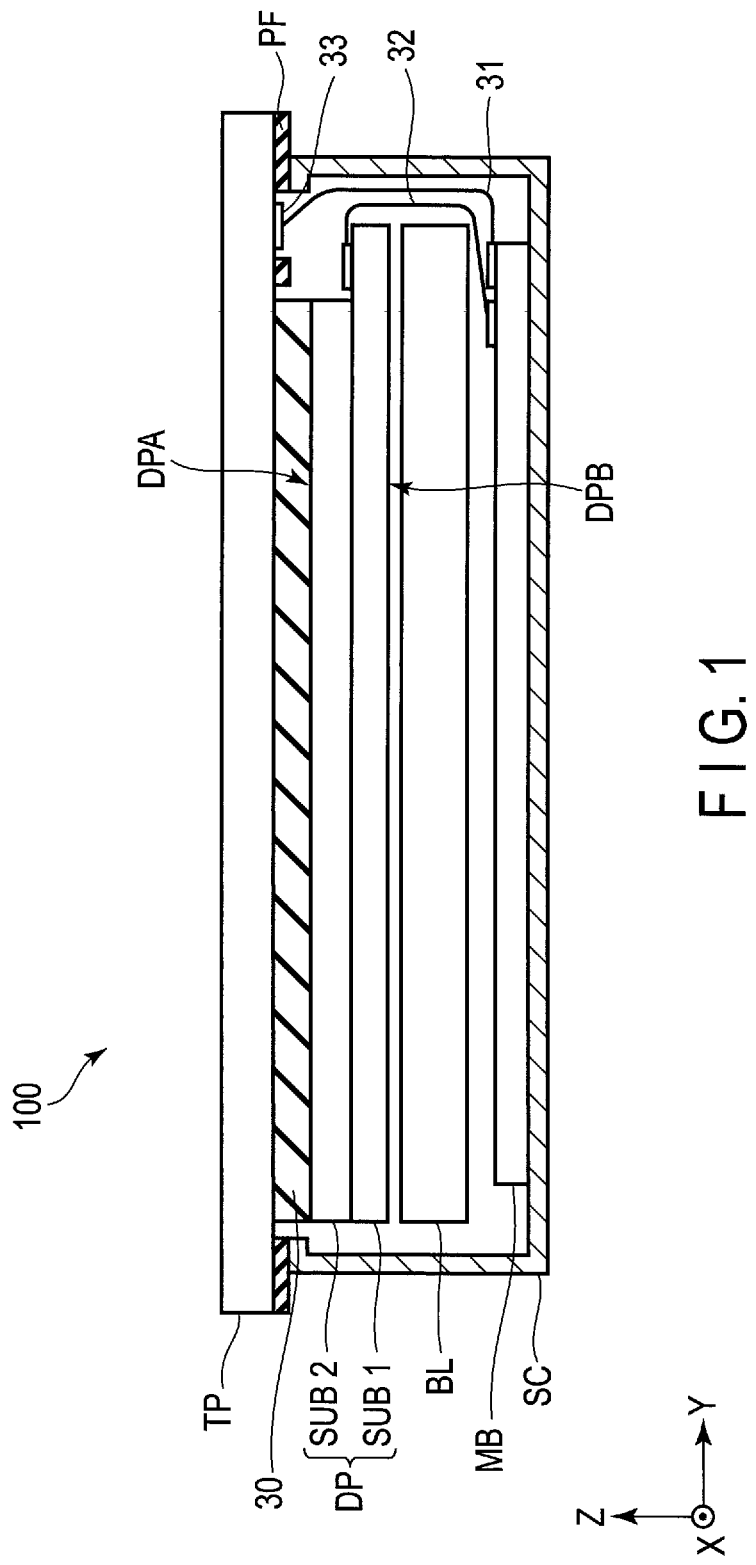
F I G. 1

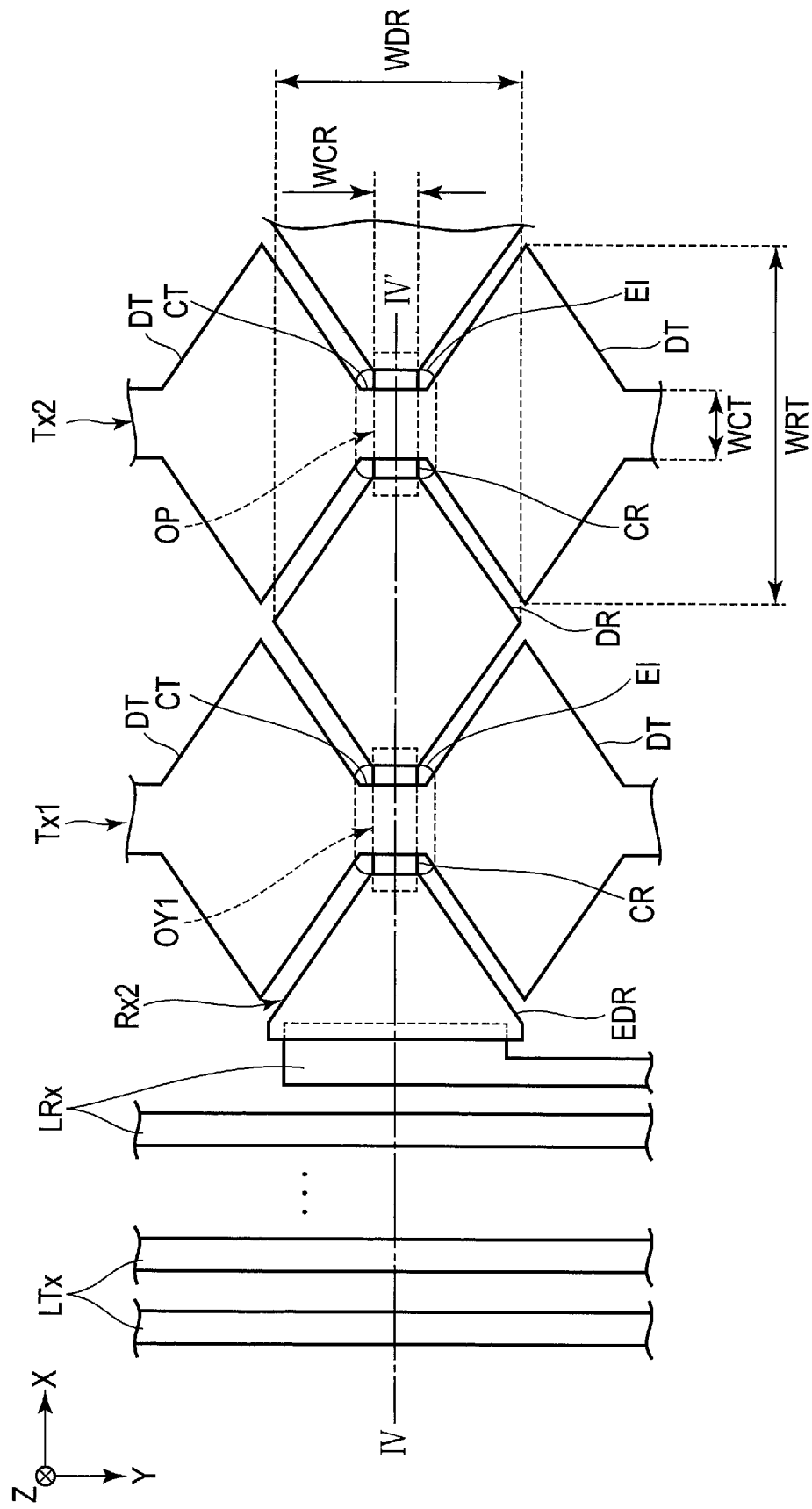
F I G. 3

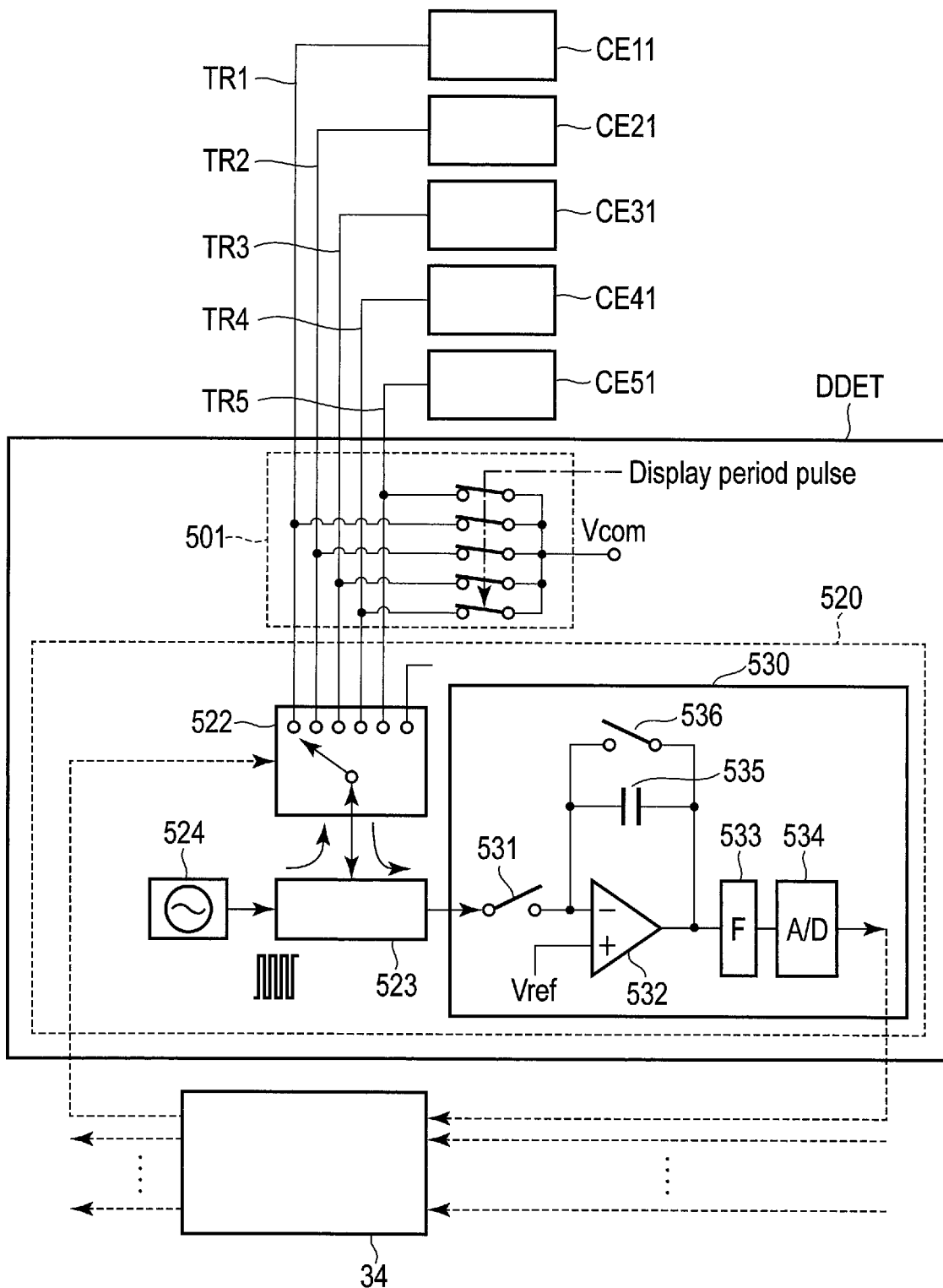
F I G. 15

DISPLAY DEVICE

CROSS-REFERENCE TO RELATED APPLICATIONS

The present application is a continuation application of U.S. patent application Ser. No. 15/817,993, filed Nov. 20, 2017, which is based upon and claims the benefit of priority from Japanese Patent Application No. 2016-231325, filed Nov. 29, 2016, the entire contents of which are incorporated herein by reference.

FIELD

Embodiments described herein relate generally to a display device comprising a touch sensor.

BACKGROUND

A mobile device (such as a smartphone, a personal digital assistant (PDA) and a tablet computer) includes a display device such as a liquid crystal display device or an organic electroluminescent (EL) display device. Further, the display device used in the mobile device generally has an additional function such as a touch sensor function.

In the meantime, with respect to the liquid crystal display device having the touch sensor function, a noise immunity test is carried out for evaluating tolerance to external electromagnetic noise. As an example of the noise immunity test, there is a test to check occurrence of an erroneous touch operation (erroneous operation) and a permanent malfunction in response to static electricity externally applied to a touch operation surface.

SUMMARY

The present disclosure generally relates to a display device.

According to one embodiment, a display device including a touch panel, a display panel opposed to the touch panel and an insulating material is provided. The touch panel includes a first substrate which is provided throughout a sensor area and a peripheral area, a first electrode and a second electrode, and an opposed portion which is located in an outermost periphery of the sensor area and where the first electrode and the second electrode are opposed to each other. The insulating material is located in a region overlapping the opposed portion or on a peripheral area side with respect to the opposed portion and contacts the touch panel and the display panel.

Additional features and advantages are described herein, and will be apparent from the following Detailed Description and the figures.

BRIEF DESCRIPTION OF THE DRAWINGS

FIG. 1 is a sectional view schematically showing a display device according to a first embodiment.

FIG. 3 is an enlarged view of a region B enclosed by a dashed line shown in FIG. 2.

FIG. 15 is a diagram showing details of the touch detection device shown in FIG. 14.

DETAILED DESCRIPTION

Figure 2:
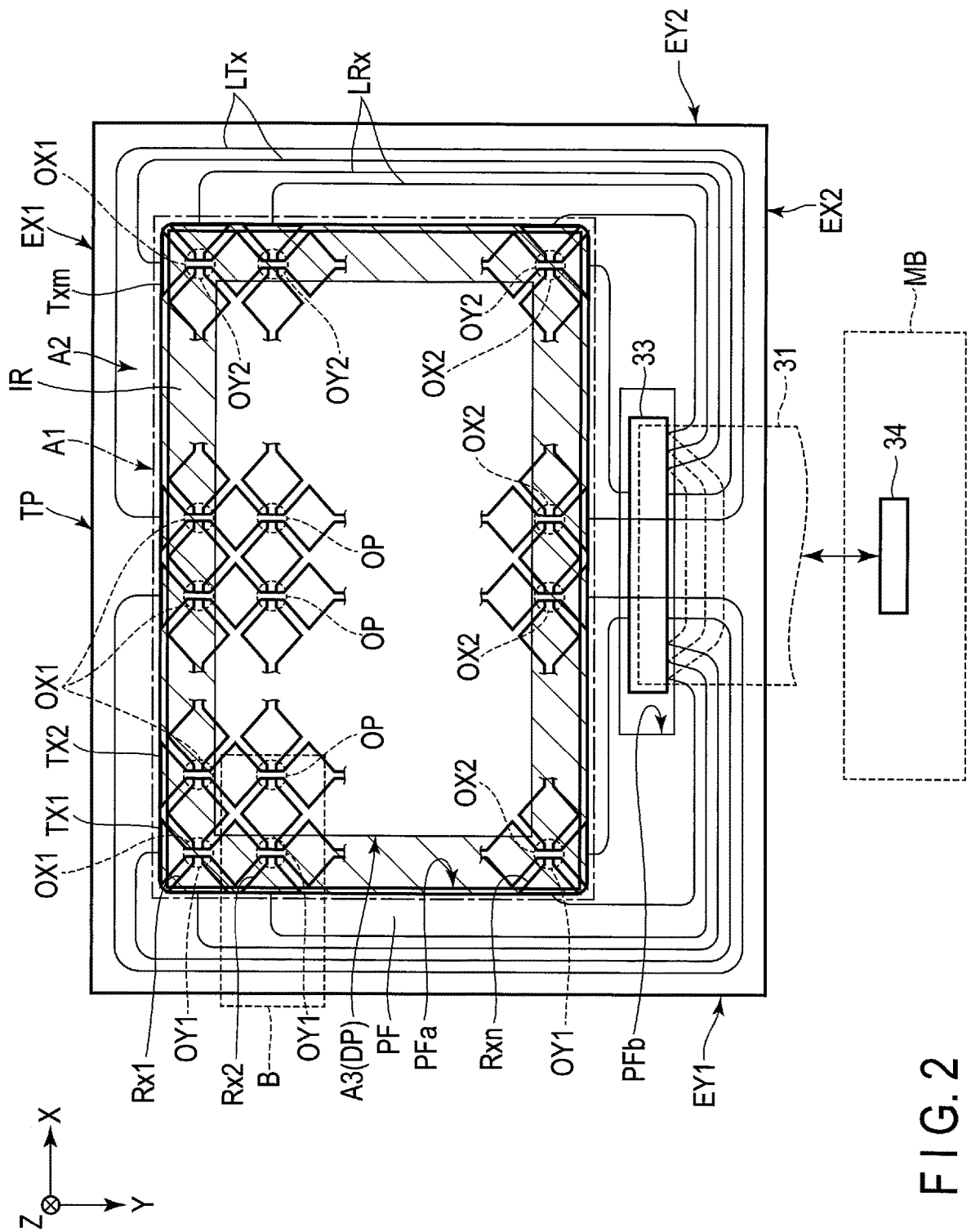
FIG. 2 is a plan view schematically showing a touch panel used in the display device shown in FIG. 1.

In general, according to one embodiment, a display device includes a touch panel, a display panel and an insulating material. The touch panel includes a first substrate, a first electrode and a second electrode, and an opposed portion, the first substrate which is provided throughout a sensor area and a peripheral area outside the sensor area and has a main surface, the first electrode and the second electrode which are arranged in the sensor area on the main surface, the opposed portion which is located in an outermost periphery of the sensor area and where the first electrode and the second electrode are opposed to each other. The display panel is opposed to the touch panel. The insulating material is located in a region overlapping the opposed portion or on a peripheral area side with respect to the opposed portion and contacts the touch panel and the display panel.

According to another embodiment, a display device includes a touch panel and a display panel. The touch panel includes a first substrate having a main surface, an electrode arranged on the main surface, an outer peripheral line electrically connected to the electrode, a first insulating layer located between the outer peripheral line and the main surface, and a first conductive layer located between the first insulating layer and the main surface. The display panel is opposed to the touch panel. The first conductive layer has a ground potential and overlaps the outer peripheral line in planar view.

Embodiments will be described hereinafter with reference to the accompanying drawings. Incidentally, the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the structural elements having functions, which are identical or similar to the functions of the structural elements described in connection with preceding drawings, are denoted by like reference numerals, and an overlapping detailed description is omitted unless otherwise necessary.

First Embodiment

In the present embodiment, a display device having a touch detection function will be described. The display device of the present embodiment can be used in various devices such as a smartphone, a tablet computer, a mobile phone, a notebook computer and a game console. The main structures described in the present embodiment can be applied to a liquid crystal display device, a self-luminous display device such as an organic electroluminecent display device, an electronic paper-type display device including an electrophoretic element, etc., a display device adopting micro-electromechanical systems (MEMS), a display device adopting electrochromism, etc. Further, as a touch detection device, either a device using a touch panel which is provided exclusively and independently from a display panel or a device using a touch panel which shares some components with a display panel can be applied.

FIG. 1 is a sectional view schematically showing a display device 100 of the present embodiment. A first direction X, a second direction Y and a third direction Z shown in the drawing orthogonally cross each other, but the first direction X and the second direction Y may cross each other at an angle other than 90 degrees. The first direction X and the second direction Y correspond to the directions parallel to the display surface, and the third direction Z corresponds to the thickness direction of the display device 100. In the following description, the third direction Z will be referred to as an upper direction (or simply above), and the direction opposite to the third direction Z will be referred to as a lower direction (or simply below). Further, a view in the third direction Z will be referred to as planar view.

The display device 100 includes a display panel DP, a touch panel TP, a backlight unit BL, a control board MB, a shield case SC, etc.

The display panel DP is an active-matrix liquid crystal display panel. The display panel DP has a transmissive display function of displaying an image by selectively transmitting light emitted from the backlight unit BL. The display panel DP includes a first substrate SUB1 and a second substrate SUB2 opposed to the first substrate SUB1, and further includes a liquid crystal layer between the first substrate SUB1 and the second substrate SUB2. The first substrate SUB1 and the second substrate SUB2 are formed of a transparent insulating substrate made of glass, resin, etc., for example. The display panel DP may be a reflective display panel having a reflective display function of displaying an image by selectively reflecting light from above (display surface side) or may be a transreflective display panel having both the transmissive display function and the reflective display function.

As described above, the display device 100 may be a display device other than a liquid crystal display device. If the display device 100 is an organic EL display device, an organic EL element provided in a display panel DP is covered with a sealing film. In the display panel DP of the organic EL display device, this sealing film corresponds to the second substrate SUB2. The touch panel TP is attached to an upper surface DPA of the display panel DP via an attachment layer 30 formed of resin, for example. The touch panel TP is formed of a transparent substrate made of synthetic resin or glass. As will be described later, the touch panel TP includes electrodes for detecting a touch operation on a side opposed to the display panel DP. Further, the touch panel TP includes a terminal 33, a protection film PF, etc., on the side opposed to the display panel DP.

The backlight unit BL is arranged in such a manner as to be opposed to a lower surface DPB of the display panel DP. As the backlight unit BL, a type of backlight unit where a light emitting element is arranged at the edge of a light guide, a type of backlight unit where a cold cathode ray tube is arranged on the back side of a light-scattering glass plate, etc., are considered, but any type of backlight unit can be used.

The control board MB is arranged below the backlight unit BL. The control board MB is equipped with an LCD controller IC chip which controls the display panel DP, a touch panel driver IC chip which drives a touch detection device which will be described later in cooperation with the LCD controller IC chip, a communication module which performs communication with the outside, a host device which is equipped with various applications and controls the operation of the liquid crystal display device, etc. To prevent external interference with the operation, the control board MB is covered with the shield case (or the film shield cover) SC formed of a metal material, for example.

The touch panel TP and the control board MB are electrically connected to each other by a touch panel flexible printed circuit (hereinafter referred to as FPC) 31. The touch panel FPC 31 is connected to the terminal 33 provided on the touch panel TP. Note that the previously-mentioned touch panel driver IC chip may be mounted on this touch panel FPC 31. The display panel DP and the control board MB are electrically connected to each other by a display panel FPC (including a chip on film (COF)) 32. Part or the whole of the previously-mentioned LCD controller IC chip may be mounted on this display panel FPC 32 or may be provided on the first substrate SUB1 which forms the display panel DP. Further, although the control board MB is attached to the shield case SC in FIG. 1, the control board MB may be attached to the lower surface of the backlight unit BL. In this case, a connector for connecting the touch panel FPC 31 to the control board MB and a connector for connecting the display panel FPC 32 to the control board MB may be attached below the control board MB.

FIG. 2 is a plan view schematically showing the touch panel TP shown in FIG. 1. FIG. 2 shows a surface parallel to an X-Y plane defined by the first direction X and the second direction Y. Note that the plan view shown in FIG. 2 corresponds to a plan view of the touch panel TP when viewed from the display panel DP side in FIG. 1.

The touch panel TP has a sensor area A1 and a peripheral area A2 located on the outside of the sensor area A1. Further, the touch panel TP has ends EX1 and EX2 in the first direction X and ends EY1 and EY2 in the second direction Y. In the example illustrated, the sensor area A1 has a rectangular shape and corresponds to a region enclosed by a one-dot chain line in the drawing. The peripheral area A2 is a region surrounding the sensor area A1 and corresponds to a frame-like region located between the sensor area A1 and the ends EX1 and EX2 and between the sensor area A1 and the ends EY1 and EY2. Further, the touch panel TP has an attachment area A3 in the sensor area A1 to which the display panel DP is attached. The attachment area A3 corresponds to a region overlapping the attachment layer 30 shown in FIG. 1. In the example illustrated, the attachment area A3 is a rectangle smaller than the sensor area A1 and is located substantially at the center of the sensor area A1.

The touch panel TP includes a plurality of first electrodes Rx (Rx1, Rx2, . . . , Rxn) for detecting a touch operation, and a plurality of second electrodes Tx (Tx1, Tx2, . . . , Txm) insulated from the first electrodes Rx and arranged in such a manner as to cross the first electrodes Rx. In the example illustrated, the first electrodes Rx extend in the first direction X and are arranged in the second direction Y at intervals. The second electrodes Tx extend in the second direction Y and are arranged in the first direction X at intervals.

As encircled by dotted lines in the drawing, opposed portions OP in which the second electrodes Tx and the first electrodes Rx are opposed to each other (cross each other) in the third direction Z are arranged in a matrix in the first direction X and the second direction Y. The opposed portions OP includes opposed portions OX1, OX2, OY1 and OY2 located in the outermost periphery of the sensor area A1. The opposed portions OX1 are arranged in the first direction X in a position near the end EX1 in the sensor area A1. The opposed portions OX2 are arranged in the first direction X in a position near the end EX2 in the sensor area A1. The opposed portions OY1 are arranged in the second direction Y in a position near the end EY1 in the sensor area A1. The opposed portions OY2 are arranged in the second direction Y in a position near the end EY2 in the sensor area A1. As an example, all the opposed portions OX1, OX2, OY1 and OY2 are located on the outside of the attachment area A3, while the other opposed portions OP located between the opposed portions OX1 and OX2 and between the opposed portions OY1 and OY2 are included in the attachment area A3.

In the present embodiment, the opposed portions OX1, OX2, OY1 and OY2 overlap an insulating material IR. In the example illustrated, the insulating material IR has the shape of a ring surrounding the attachment area A3 shown as a diagonally shaded area.

The touch panel TP includes outer peripheral lines LTx and LRx, the terminal 33 and the protection film PF in the peripheral area A2.

The outer peripheral line LTx is electrically connected to each second electrode Tx, and the outer peripheral line LRx is electrically connected to each first electrode Rx. Each line of the second electrodes Tx forms a loop by the outer peripheral line LTx. That is, the outer peripheral lines LTx arranged in a left half region of the touch panel TP in FIG. 2 form loops by passing through a region on the end EY1 side of the touch panel TP. The outer peripheral lines LTx arranged in a right half region of the touch panel TP form loops by passing through a region on the end EY2 side of the touch panel TP. Further, the outer peripheral lines LRx form loops by passing through a region on the end EX2 side of the touch panel TP. Note that the loops of the outer peripheral lines LTx may be formed only on either the right half or the left half of the tough panel TP. Further, the loops of the outer peripheral lines LRx may be formed only on either the right half or the left half of the touch panel TP.

The protection film PF is provided in a region overlapping the outer peripheral lines LTx and LRx. In the example illustrated, the protection film PF overlaps the ends of the first electrodes Rx and the second electrodes Tx. The protection film PF has a rectangular opening portion PFa in a region opposed to (overlapping) the sensor area A1. All the opposed portions OP including the opposed portions OX1, OX2, OY1 and OY2 are located in a region overlapping the opening portion PFa. Further, the protection film PF has an opening portion PFb between the end EX2 and the opening portion PFa.

The terminal 33 is provided between the end EX2 and the sensor area A1. In the example illustrated, the terminal 33 is located within a region where the opening portion PFb is formed. The terminal 33 is a line aggregation portion for connecting the outer peripheral lines LTx and LRx to the outside. The touch panel FPC 31 is attached to the terminal 33. The outer peripheral lines LTx and LRx connected to the terminal 33 are electrically connected to a touch panel driver IC chip 34 mounted on the control board MB via the touch panel FPC 31.

The above-described example is presented as one example, and the shapes and patterns of the first electrodes Rx and the second electrodes Tx are not necessarily limited to the shapes and patterns shown in the drawing. Although the outer peripheral lines LTx and LRx are assumed to form loops in the above description, the outer peripheral lines LTx and LRx do not necessarily form loops. As long as the first electrodes Rx and the second electrodes Tx are electrically connected to the touch panel driver IC chip 34 via the touch panel FPC 31, any structure can be applied. Further, the arrangement position of the terminal 33 is not necessarily limited to the inside of the loops of the outer peripheral lines LTx and LRx as shown in the drawing. The terminal 33 may be arranged further on the end EX 2 side, for example.

FIG. 3 is an enlarged view of a region B enclosed by a dotted line shown in FIG. 2.

The first electrode Rx2 has an electrode portion DR and a connection portion CR. The electrode portion DR and the connection portion CR are alternately arranged in the first direction X. Electrode portions EDR (only one of which is shown in FIG. 3) located on both ends of the first electrode Rx are connected to the adjacent electrode portions DR by the connection portions CR and are also connected to the outer peripheral lines LRx.

The electrode portion DR is responsible for part of the detection function of the first electrode Rx, for example. The electrode portion DR has a substantially rhombic shape, for example. The electrode portion EDR has a substantially triangular shape and has about half the area of the other electrode portion DR.

The connection portion CR is located between the electrode portion DR and the electrode portion DR which are adjacent to each other, and connects the electrode portion DR and the electrode portion DR to each other. Further, the connection portion CR is located between the electrode portion EDR and the electrode DP which are adjacent to each other, and connects the electrode portion EDR and the electrode portion DR to each other. The connection portion CR has a substantially rectangular shape having long sides in the first direction X, and both ends in the first direction X overlap different electrode portions DR (or EDR), respectively. The area of the connection portion CR is less than the area of the electrode portion DR and the area of the electrode portion EDR. Further, a width WCR of the connection portion CR is less than a maximum width WDR of the electrode portion DR in the second direction Y.

The second electrode Tx has an electrode portion DT and a connection portion CT. The electrode portion DT and the connection portion CT are alternately arranged in the second direction Y. The electrode portion DT has a substantially rhombic shape, and the connection portion CT has a substantially rectangular shape having long sides in the second direction Y. In the example illustrated, the electrode portion DT and the connection portion CT are integrally formed with each other. The area of the connection portion CT is less than the area of the electrode portion DT. Further, a width WCT of the connection portion CT is less than a maximum width WDT of the electrode portion DT in the first direction X.

The opposed portion OP corresponds to a region where the connection portion CR and the connection portion CT cross each other. An interelectrode insulating layer EI is provided between the connection portion CR and the connection portion CT. In this way, the first electrode Rx and the second electrode Tx are insulated from each other. Although the connection portion CT overlaps the connection portion CR above the connection portion CR in the example illustrated, the connection portion CR may overlap the connection portion CT above the connection portion CT instead.

In the present embodiment, the first electrode Rx and the second electrode Tx may be used as mutual-capacitive electrodes or may be used as self-capacitive electrodes. In the case of mutual-capacitive electrodes, for example, the first electrode Rx corresponds to a detection electrode, and the second electrode Tx corresponds to a drive electrode. In the case of self-capacitive electrodes, both the first electrode Rx and the second electrode Tx correspond to detection electrodes which drive signals are applied to and detect an external object.

Figure 4A:
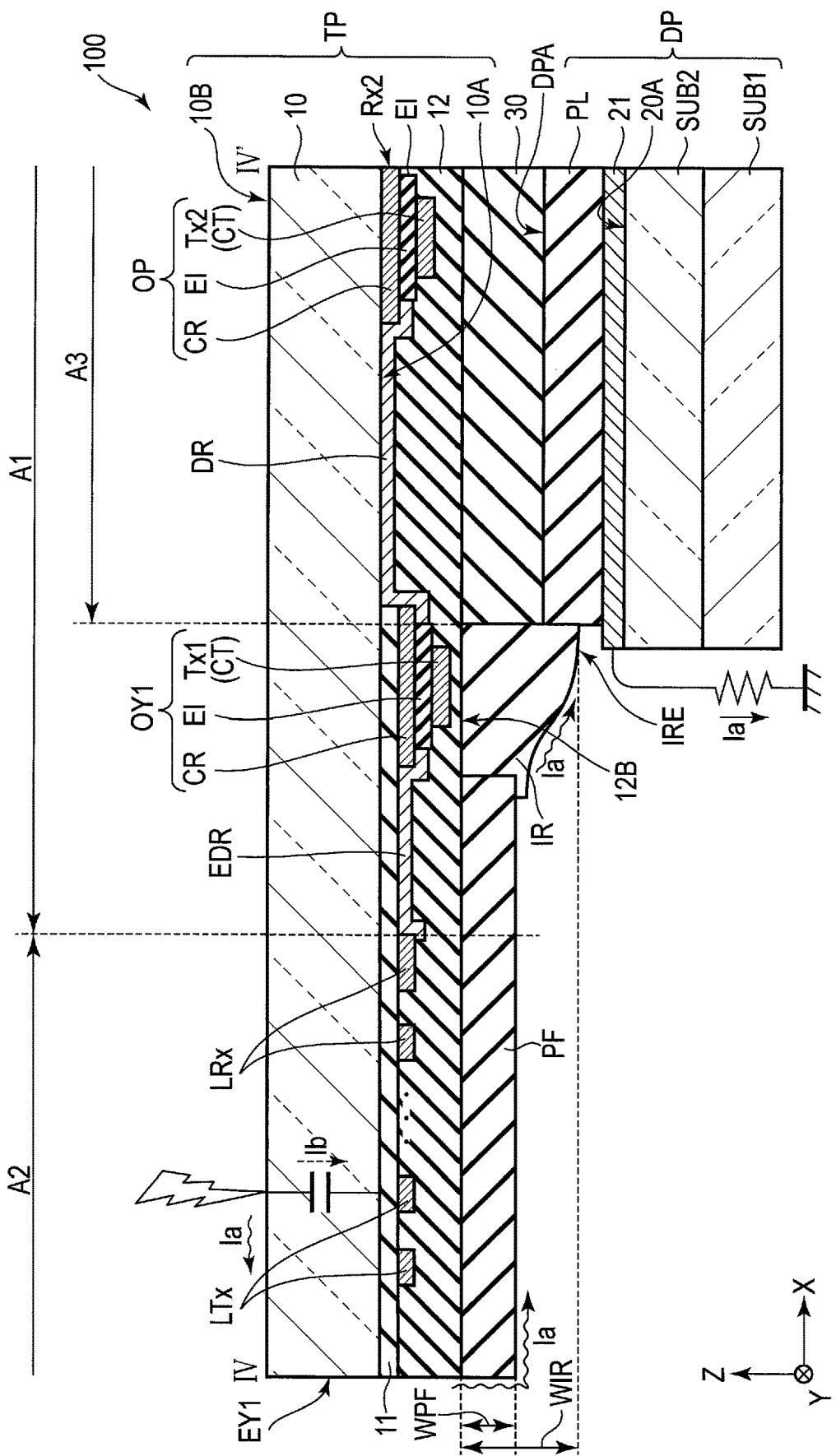
FIG. 4A is a sectional view taken along line IV-IV' shown in FIG. 3.

FIG. 4A is a sectional view taken along line IV-IV' shown in FIG. 3. The display device 100 includes the touch panel TP, the display panel DP, the attachment layer 30 located between the touch panel TP and the display panel DP, etc.

The touch panel TP comprises a substrate 10 formed of a transparent insulating material such as resin or glass. The substrate 10 is formed throughout the sensor area A1 and the peripheral area A2. The substrate 10 has a first main surface 10A opposed to the display panel DP, and a second main surface 10B opposite to the first main surface 10A and functioning as a touch operation surface. The touch panel TP includes the first electrode Rx, the second electrode Tx, the interelectrode insulating layer EI, the opposed portions OP and OY1 formed of these structural elements, the outer peripheral lines LTx and LRx, a first insulating film 11, a second insulating film 12, the protection film PF, etc., on the first main surface 10A.

The first insulating film 11 is formed on the first main surface 10A on the outside of the attachment area A3, that is, between the attachment area A3 and the end EY1. The first insulating film 11 is formed of black colored resin (decorative ink), for example. Another insulating layer may be interposed between the first insulating film 11 and the first main surface 10A.

The outer peripheral lines LTx and LRx are arranged in the first direction X at intervals and contact the first insulating film 11. The outer peripheral lines LTx and LRx are formed of a metal material such as aluminum or titanium, for example.

The opposed portion OY1 is located in the outermost periphery of the sensor area A1 (or between the peripheral area A2 and the attachment area A3) and includes the connection portion CR, the interelectrode insulating layer EI and the connection portion CT. The interelectrode insulating layer EI contacts the connection portion CR and the connection portion CT between the connection portion CR and the connection portion CT. The connection portion CR is closer to the substrate 10 than the connection portion CT and contacts the first insulating film 11.

The electrode portion EDR contacts the first insulating film 11 between the outer peripheral line LRx and the opposed portion OY1. One end of the electrode portion EDR in the first direction X contacts the outer peripheral line LRx, and the other end contacts the connection portion CR which forms the opposed portion OY1.

The opposed portion OP is located in the attachment area A3 and includes the connection portion CR, the interelectrode insulating layer EI and the connection portion CT. The interelectrode insulating layer EI contacts the connection portion CR and the connection portion CT between the connection portion CR and the connection portion CT. The connection portion CR is closer to the substrate 10 than the connection portion CT and contacts the first main surface 10A.

The electrode portion DR contacts the first main surface 10A between the opposed portion OY1 and the opposed portion OP. One end of the electrode portion DR in the first direction X contacts the connection portion CR which forms the opposed portion OY1 and also contacts the first insulating film 11. The other end of the electrode portion DR contacts the connection portion CR which forms the opposed portion OP.

The electrode portion EDR, the electrode portion DR and the connection portion CT (second electrode Tx) can be formed of the same material and are formed of a transparent conductive material such as indium tin oxide (ITO) or indium zinc oxide (IZO), for example. The connection portion CR may be formed of the same material as that of the electrode portion DR, etc., or may be formed of a different material from that of the electrode portion DR, etc., or may be formed of a metal material such as aluminum or titanium.

The second insulating film 12 covers the first electrode Rx2, the second electrodes Tx1 and Tx2 and the outer peripheral lines LTx and LRx and also contacts the first insulating film 11. The second insulating film 12 is formed of transparent resin, for example.

The protection film PF is provided in the peripheral area A2 and contacts the second insulating film 12. In the example illustrated, the protection film PF also extends in the sensor area A1 and overlaps the electrode portion EDR, but the protection film PF may be provided in a region overlapping at least the outer peripheral lines LTx and LRx. The protection film PF is formed of polyethylene terephthalate (PET), for example.

The display panel DP includes the first substrate SUB1, the second substrate SUB2, a first conductive layer 21, an optical element PL, etc.

The first substrate SUB1 and the second substrate SUB2 are formed of a transparent insulating substrate made of resin, glass, etc. The first substrate SUB1 and the second substrate SUB2 are opposed and attached to each other, and a liquid crystal layer which is not shown in the drawing is held between the first substrate SUB1 and the second substrate SUB2. In the example illustrated, the second substrate SUB2 is closer to the touch panel TP than the first substrate SUB1 and has a first main surface 20A opposed to the touch panel TP. The first conductive layer 21 is formed on the entire first main surface 20A. The first conductive layer 21 is formed of a transparent conductive material such as indium tin oxide (ITO) or indium zinc oxide (IZO), for example. The potential of the first conductive layer 21 is a reference potential (for example a ground potential). Accordingly, for example, if an ESD noise current is generated from the outside of the display device 100, the electric current traveling through the creepage surface of the display device 100 can be absorbed, and the influence of noise on the display panel DP can be suppressed. The optical element PL is provided above the first conductive layer 21, that is, on the opposite side to the second substrate SUB2 with respect to the first conductive layer 21. The optical element PL includes a polarizer, for example, and may include another optical element such as a retardation film, etc., as needed.

The display panel DP having the above-described structure is attached to the attachment area A3 of the touch panel TP via the attachment layer 30. In the example illustrated, the upper surface DPA of the display panel DP corresponds to the upper surface of the optical element PL and contacts the attachment layer 30.

The insulating material IR contacts the touch panel TP and the display panel DP and covers the opposed portion OY1. More specifically, the insulating material IR contacts the protection film PF in the touch panel TP and contacts the optical element PL in the display panel DP. In the example illustrated, the insulating material IR also contacts the second insulating film 12 and the attachment layer 30 between the protection film PF and the optical element PL. In the third direction Z, a thickness WIR of the insulating material IR is greater than a thickness WPF of the protection film PF. Here, the thickness WIP of the insulating material IR is the distance between a lower surface 12B of the second insulating film 12 and a furthest end IRE of the insulating material IR from the lower surface 12B of the second insulating film 12 in the third direction Z. The insulating material IR may be formed of a different material from that of the attachment layer 30. For example, the attachment layer 30 is formed of acrylic resin, etc., and the insulating material IR is silicon resin. The insulating material IR should preferably have volume resistivity of $10^{14}$ to $10^{16}$ Ω·cm, for example.

Figure 5:
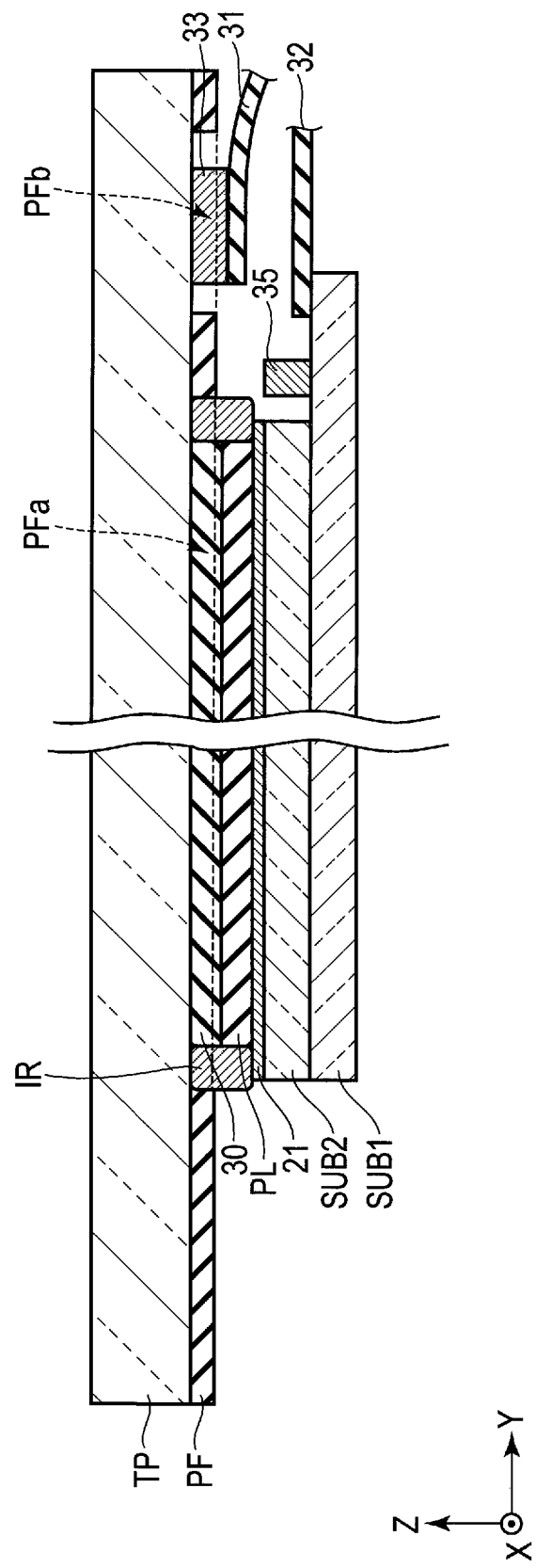
FIG. 5 is a sectional view schematically showing the whole structures of the touch panel and a display panel.

FIG. 5 is a sectional view schematically showing the whole structures of the touch panel TP and the display panel DP. Note that only the main structural elements are shown in FIG. 5.

The insulating material IR is provided within a region where the opening portion PFa of the protection film PF is formed. The attachment layer 30 and the optical element PL are located within a region where the insulating material IR is provided. The terminal 33 is located in a region where the opening portion PFb of the protection film PF is formed and is electrically connected to the touch panel FPC 31. The first substrate SUB1 has an extension region which extends further from the second substrate SUB2 in the second direction Y, and includes a LCD controller IC chip 35 and the display panel FPC 32 in this extension region.

Figure 6:
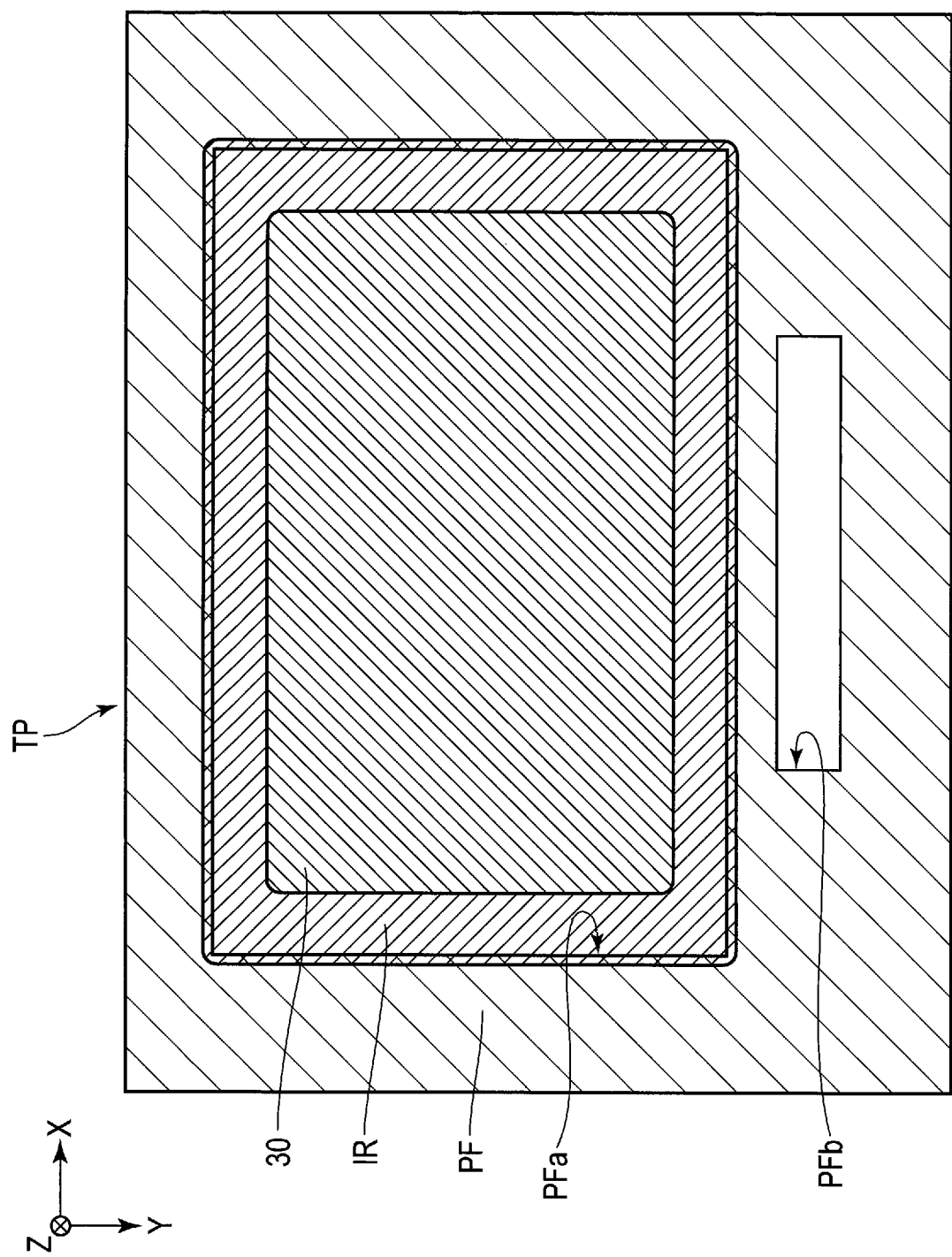
FIG. 6 is a plan view showing the positions of an attachment layer, an insulating material and a protection film.

FIG. 6 is a plan view showing the positions of the attachment layer 30, the insulating material IR and the protection film PF.

The attachment layer 30 is provided substantially at the center of the touch panel TP and is indicated by rising diagonal lines in the drawing. The protection film PF is provided in the periphery of the touch panel TP and is indicated by wide-spaced rising diagonal lines. The insulating material IR is outside the attachment layer 30 and inside the opening portion PFa and is indicated by falling diagonal lines. That is, the insulating material IR is provided between the attachment layer 30 and the protection film PF. In the example illustrated, the insulating material IR has a ring-like shape.

Figure 4B:
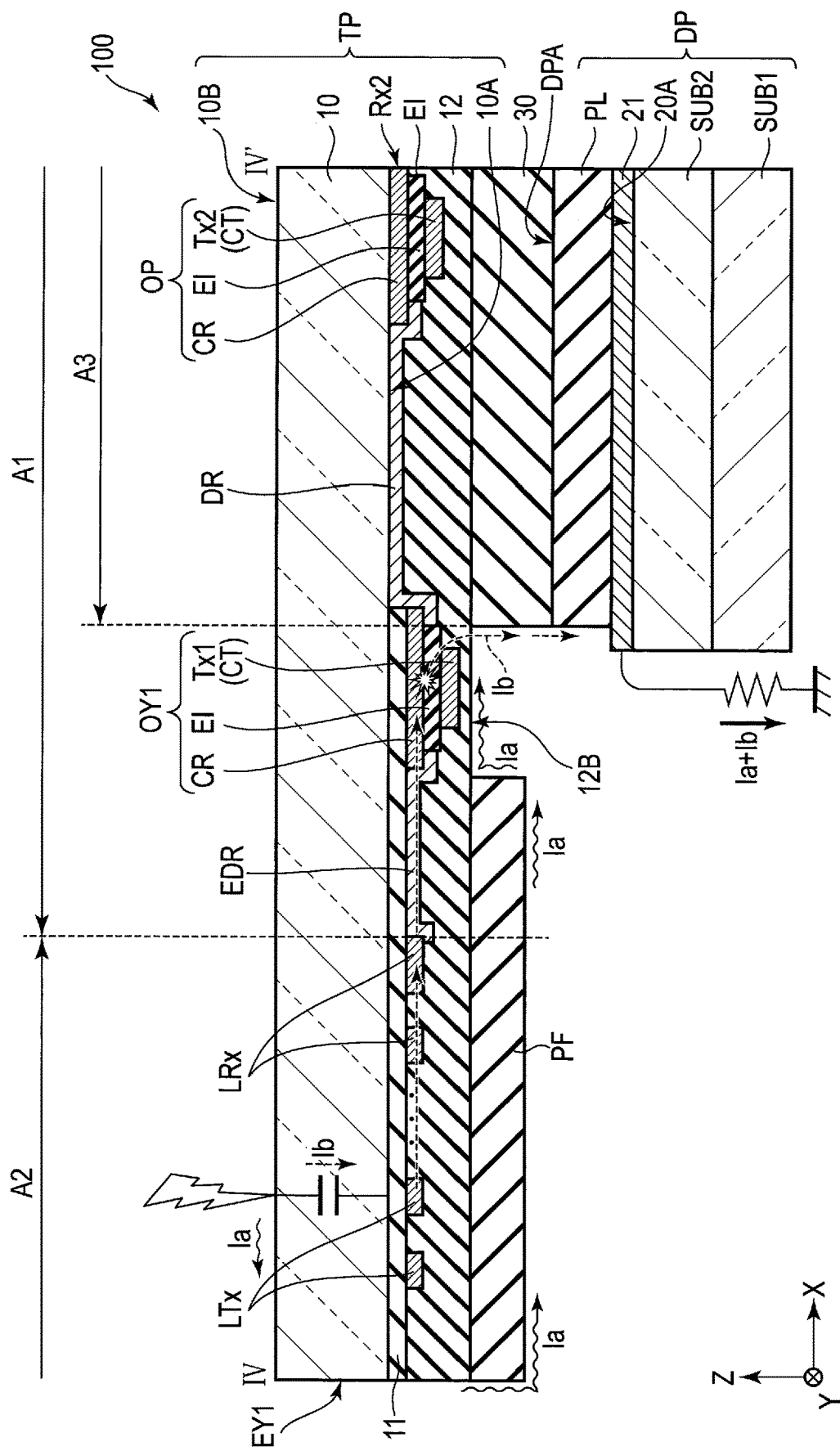
FIG. 4B is a sectional view showing a comparative example of FIG. 4A.

Since the insulating material IR is arranged in this manner, as will be described below, a noise current path can be blocked, and breakage of the display device 100 can be prevented. For example, it is assumed that electrostatic discharge occurs on the second main surface 10B as shown in FIG. 4B. At this time, a noise current may be generated in association with the electrostatic discharge. Part of a noise current Ia travels through the creepage surface of the touch panel TP. Further, part of a noise current Ib may be capacitively-coupled with part of the outer peripheral lines LTx and LRx via the substrate 10 and the first insulating film 11.

After passing through the outer peripheral lines LTx and LRx by the capacitive coupling, the noise current Ib travels to the first conductive layer 21 of the display panel DP which is maintained at a reference potential (a ground potential), for example. The noise current Ib reaches the opposed portion OY1 via the electrode portion EDR electrically connected to the outer peripheral line LRx. As described above, the electrode portion EDR and the connection portion CR are formed, for example, of indium tin oxide or indium zinc oxide and thus have a higher resistance than the outer peripheral lines LTx and LRx. Further, the connection portion CR and the connection portion CT which form the opposed portion OY1 has a smaller area as compared to the electrode portion EDR. Therefore, the opposed portion OY1 becomes an impedance change point, and the energy of the noise current Ib concentrates on the opposed portion OY1. As a result, if the noise current Ib passes to the first conductive layer 21 through the opposed portion OY1, electrical breakdown occurs in the interelectrode insulating layer EI located between the connection portion CR and the connection portion CT. After passing from the connection portion CR to the connection portion CT by the electrical breakdown, the noise current Ib travels through the creepage surfaces of the attachment layer 30 and the optical element PL and is absorbed by the first conductive layer 21. Further, the noise current Ia travels through the end EY1 and travels through the creepage surfaces of the protection film PF, the second insulating film 12, the attachment layer 30 and the optical element PL, and is then absorbed by the first conductive layer 21.

On the other hand, according to the present embodiment, the insulating material IR is provided between the opposed portion OY1 and the first conductive layer 21 as shown in FIG. 4A. The insulating material IR covers the opposed portion OY1 and contacts the protection film PF, the second insulating film 12, the attachment layer 30 and the optical element PL. By providing the insulating material IR of a sufficient thickness (quantity), the resistance of the current path between the opposed portion OY1 and the first conductive layer 21 is increased. Therefore, the path of the noise current Ib flowing into the first conductive layer 21 through the opposed portion OY1 is nearly blocked. As a result, the noise current Ib flowing into the opposed portion OY1 is reduced, and thus the electrical breakdown of the interelectrode insulating layer EI can be prevented, and the breakage of the display device 100 can be prevented. The noise current Ia traveling through the creepage surface of the touch panel TP reaches the first conductive layer 21 through the creepage surface of the insulating material IR (surface thereof which does not contact any of the protection film PF, the second insulating film 12, the attachment layer 30 and the optical element PL), but as compared to the noise current Ib, the noise current Ia makes a smaller contribution to the electrical breakdown of the interelectrode insulating layer EI.

Second Embodiment

Figure 7:
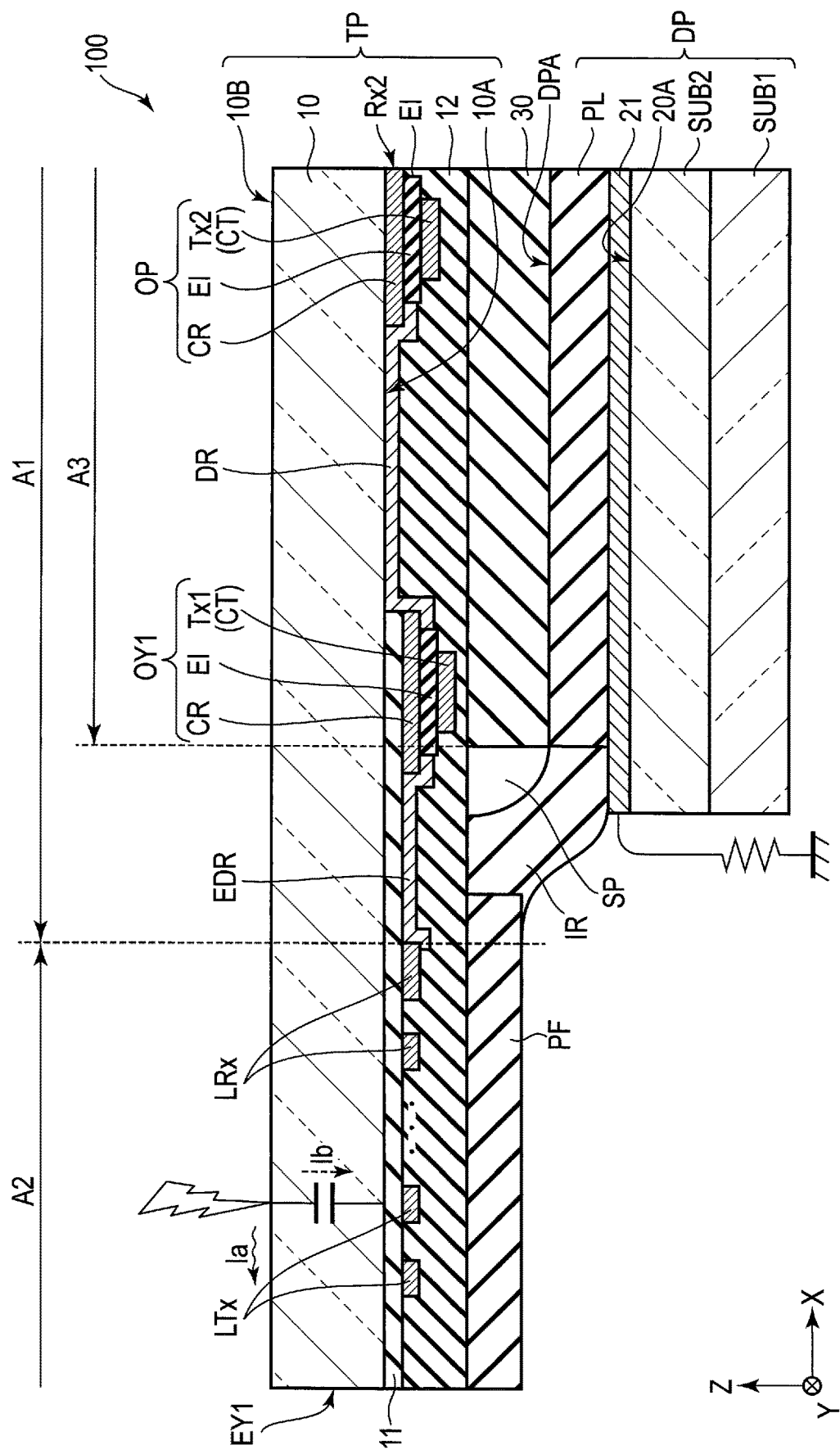
FIG. 7 is a sectional view schematically showing a display device according to a second embodiment.

FIG. 7 is a sectional view schematically showing the touch panel TP of the display device 100 according to the second embodiment. The second embodiment differs from the first embodiment in that the insulating material IR is located on the outside, i.e., the peripheral area A2 side with respect to the opposed portion OY1.

In the second embodiment, the opposed portion OY1 is included in the attachment area A3. Further, part of the insulating material IR is spaced apart from the second insulating film 12 and the attachment layer 30, between the protection film PF and the optical element PL. That is, space SP is formed between the insulating material IR, and the touch panel TP and the display panel DP. For example, air, etc., may be included in the space SP. In the second embodiment also, the same effect as that of the first embodiment can be produced by providing the insulating material IR in sufficient quantity to increase the resistance between the opposed portion OY1 and the first conductive layer 21.

Third Embodiment

Figure 8:
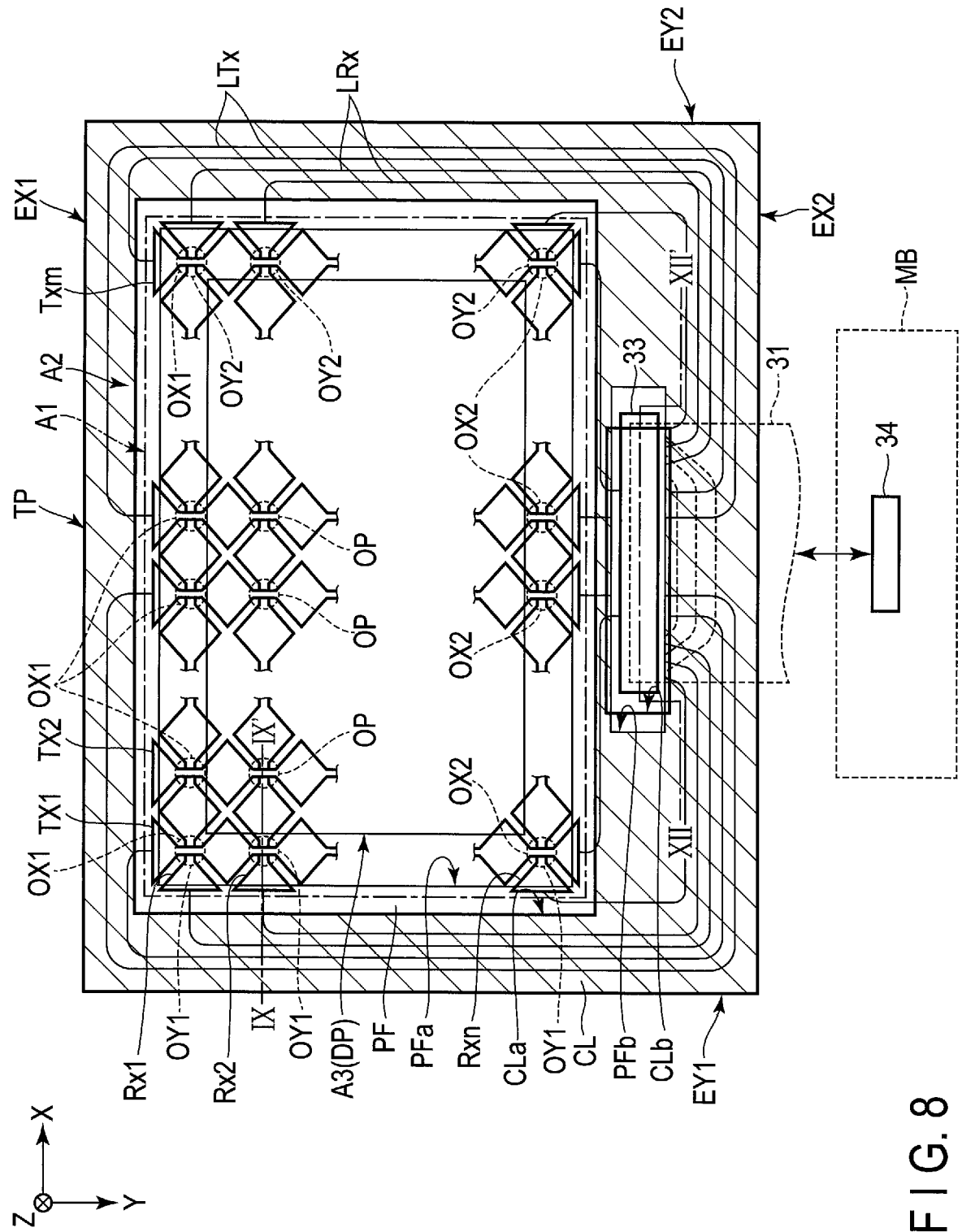
FIG. 8 is a plan view schematically showing a touch panel of a display device according to a third embodiment.

FIG. 8 is a plan view schematically showing the touch panel TP of the display device 100 according to the third embodiment. The third embodiment differs from the first embodiment in that a second conductive layer CL of a reference potential (for example a ground potential) is provided in the peripheral area A2 and the insulating material IR is not provided.

The second conductive layer CL overlaps the outer peripheral lines LTx and LRx as indicated by diagonal lines. In the example illustrated, the second conductive layer CL has the shape of a ring surrounding the sensor area A1 and the attachment area A3 and has a rectangular opening portion CLa. Further, the second conductive layer CL has an opening portion CLb between the sensor area A1 and the end EX2. In the example illustrated, the opening portion CLb has a rectangular shape. The terminal 33 is located within a region where the opening portion CLb is formed, but one end in the first direction X overlaps the second conductive layer CL.

Figure 9:
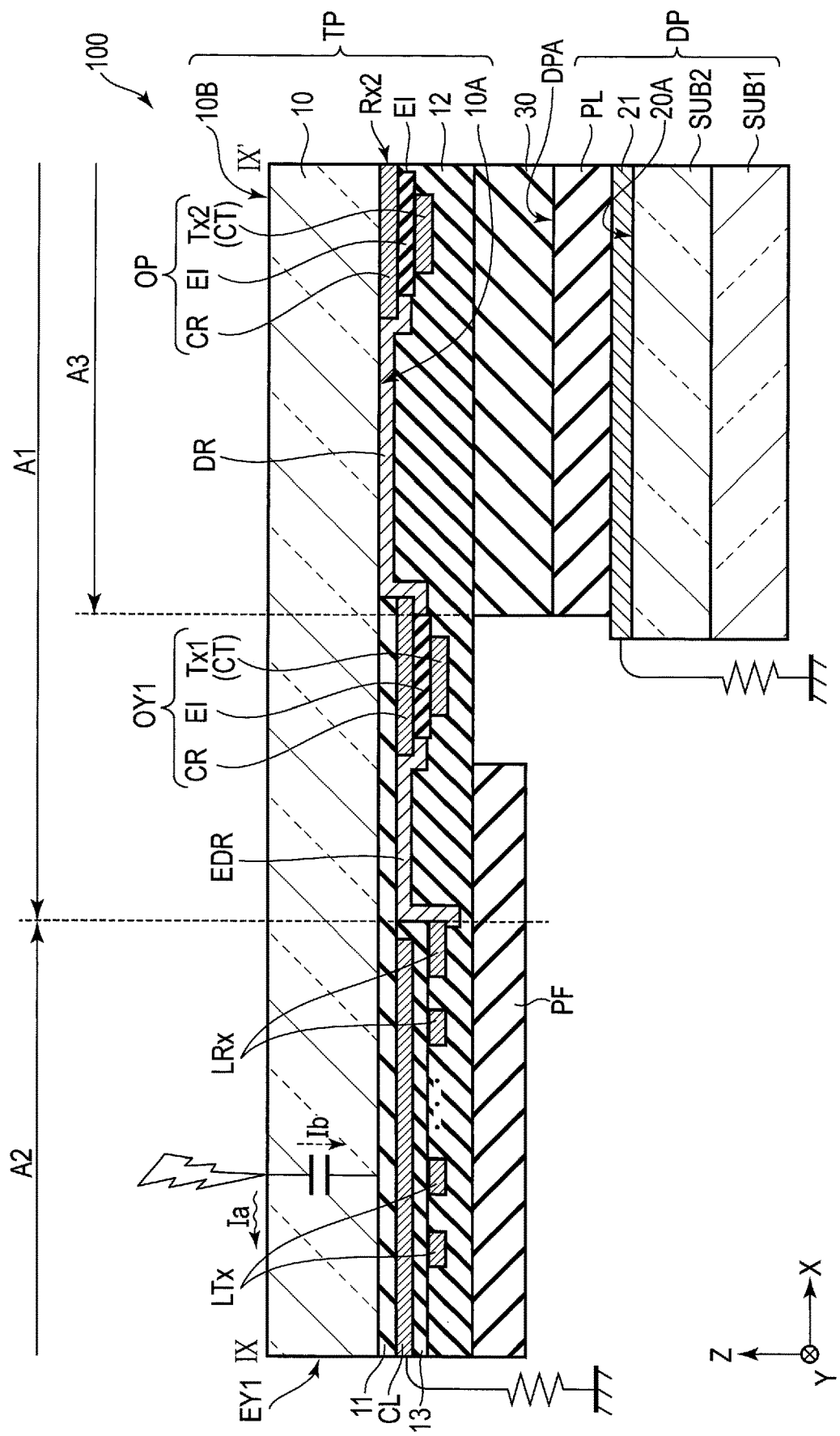
FIG. 9 is a sectional view taken along line IX-IX' shown in FIG. 8.

FIG. 9 is a sectional view taken along line IX-IX' shown in FIG. 8.

The touch panel TP includes the second conductive layer CL and a third insulating film 13, in addition to the first electrode Rx, the second electrode Tx, the interelectrode insulating layer EI, the opposed portions OP and OY1, the outer peripheral lines LTx and LRx, the first insulating film 11, the second insulating film 12 and the protection film PF. The second conductive layer CL and the third insulating film 13 are located between the first insulating film 11 and the outer peripheral lines LTx and LRx.

The second conductive layer CL is closer to the first insulating film 11 than the third insulating film 13 and contacts the first insulating film 11 and the third insulating film 13. In the example illustrated, the second conductive layer CL is interposed between the first insulating film 11 and all the outer peripheral lines LTx and LRx. The second conductive layer CL may be formed of a transparent conductive material such as indium tin oxide (ITO) or indium zinc oxide, for example, or may be formed of a metal material such as aluminum or titanium, for example. Therefore, the second conductive layer CL can be formed together with the electrode portions EDR and DR and the connection portion CT (second electrode Tx) simultaneously by using the same material or may be formed together with the connection portion CR simultaneously by using the same material.

The third insulating film 13 is located between the second conductive layer CL and the outer peripheral lines LTx and LRx and overlaps a region where the second conductive layer CL is provided. In the example illustrated, the third insulating film 13 contacts the second conductive layer CL and the outer peripheral lines LTx and LRx, but other insulating films may be interposed between the third insulating film 13 and the second conductive layer CL and between the third insulating film 13 and the outer peripheral lines LTx and LRx. Further, the third insulating film 13 contacts the first insulating film 11 between the second conductive layer CL and the electrode portion EDR in the first direction X. At least one of the third insulating film 13 and the first insulating film 11 is black colored, for example.

Figure 10:
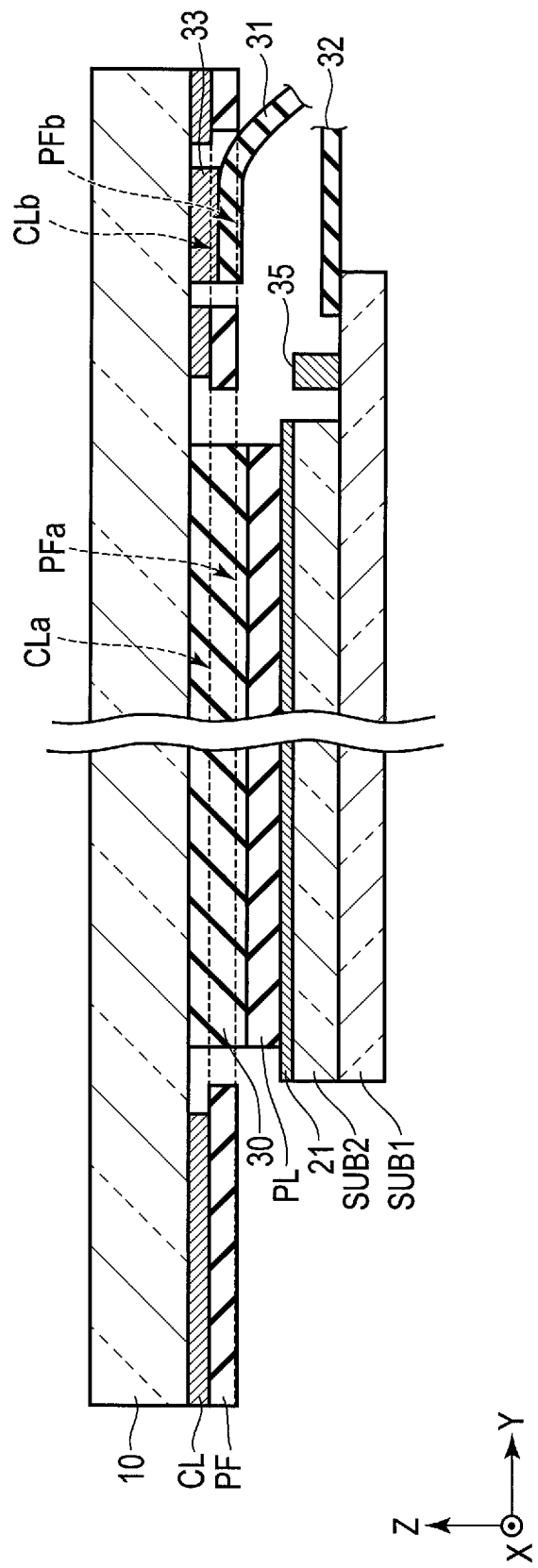
FIG. 10 is a sectional view schematically showing the whole structures of the touch panel and a display panel.

FIG. 10 is a sectional view schematically showing the whole structures of the touch panel TP and the display panel DP. Only the main structural elements are shown in FIG. 10.

The second conductive layer CL is located between the substrate 10 and the protection film PF. Further, the second conductive layer CL is further from the attachment layer 30 than the protection film PF. The terminal 33 is located in a region where the opening portion PFb of the protection film PF and the opening portion CLb of the second conductive layer CL are formed, and is electrically connected to the touch panel FPC 31.

Figure 11:
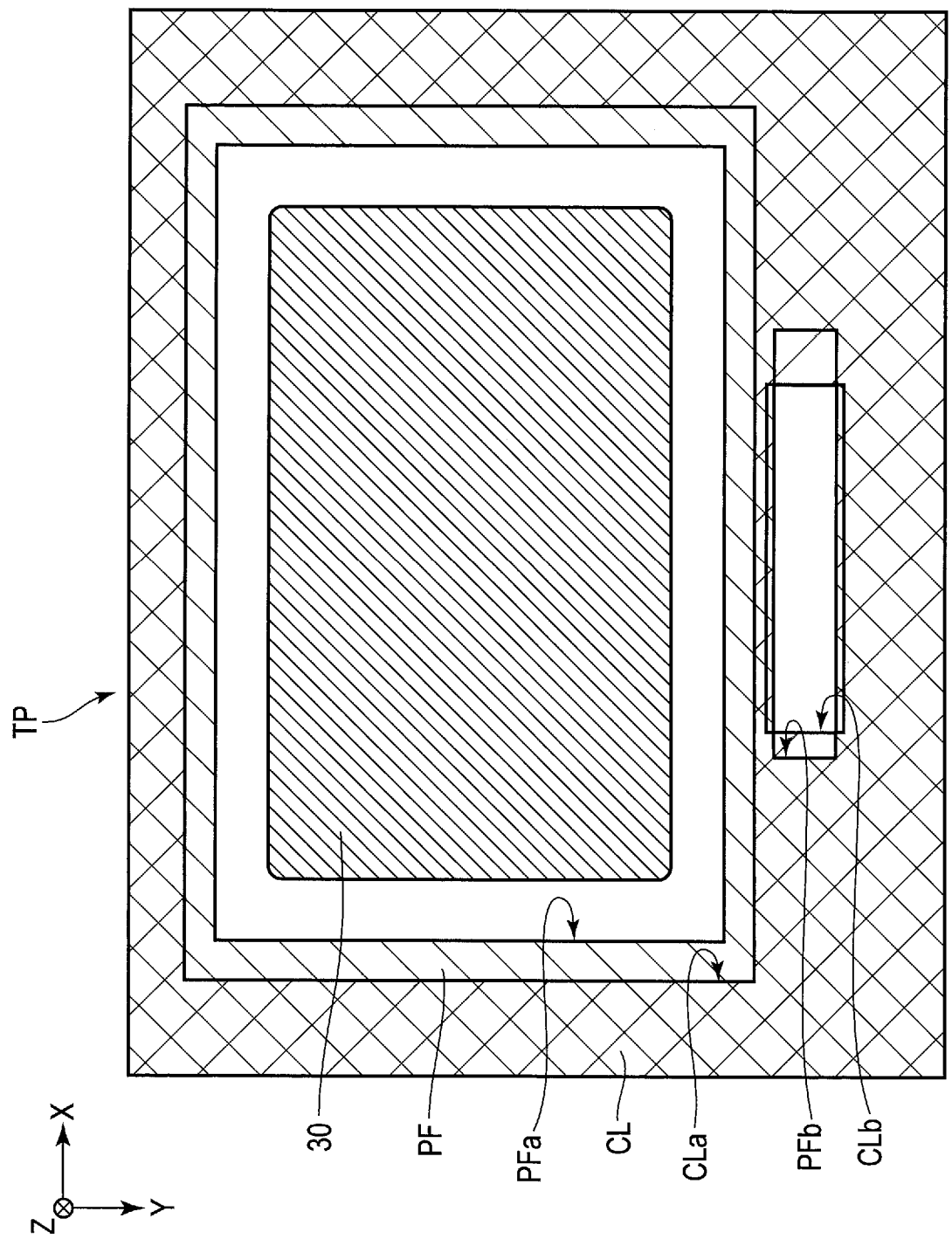
FIG. 11 is a plan view showing the positions of an attachment layer, a protection film and a second conductive layer.

FIG. 11 is a plan view showing the positions of the attachment layer 30, the protection film PF and the second conductive layer CL. A region shaded by wide-spaced rising diagonal lines corresponds to a region where the protection film PF is provided, and a region shaded by falling diagonal lines corresponds to a region where the second conductive layer CL is provided. Further, a region where the wide-spaced rising diagonal lines and the falling diagonal lines cross each other corresponds to a region where the protection film PF and the second conductive layer CL overlap each other.

The second conductive layer CL is provided in a region substantially overlapping the protection film PF. The opening portion CLa is larger than the opening portion PFa. That is, the opening portion PFa and the attachment layer 30 are located within a region where the opening portion CLa is formed. The attachment layer 30 is located within a region where the opening portion PFa is formed.

Figure 12:
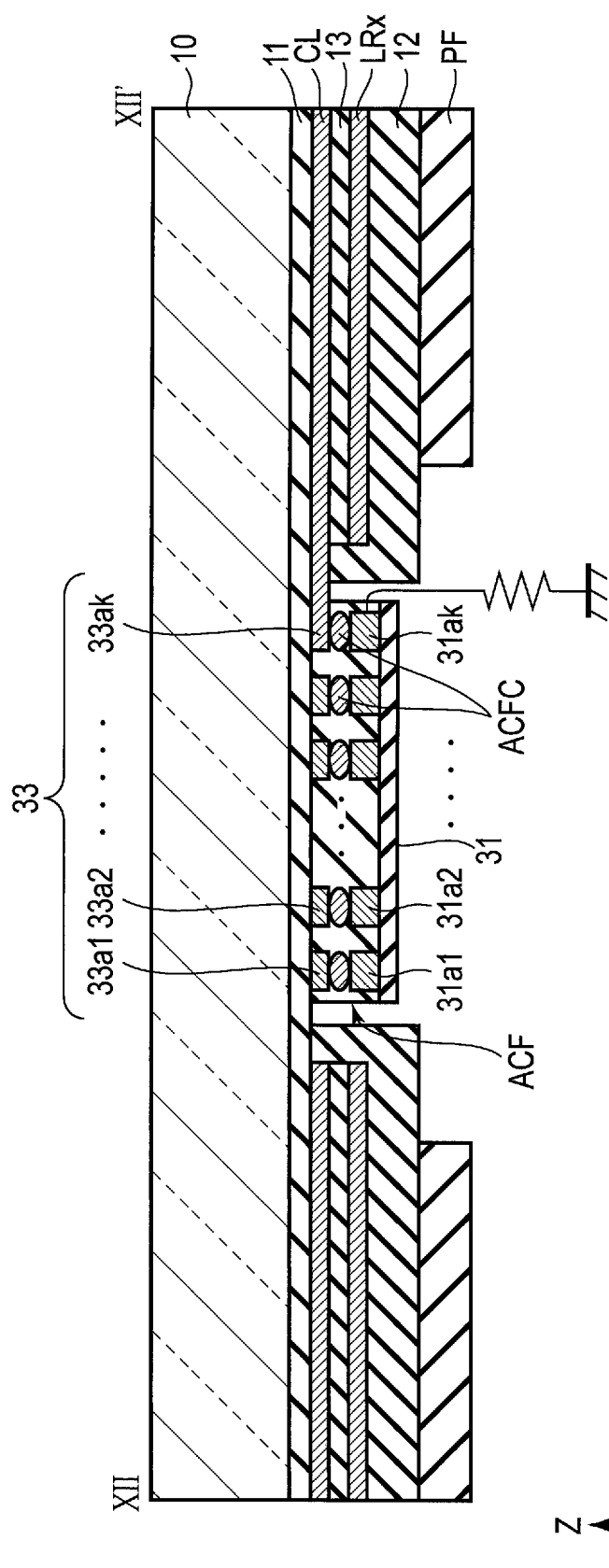
FIG. 12 is a sectional view taken along line XII-XII' shown in FIG. 8.

FIG. 12 is a sectional view taken along line XII-XII' shown in FIG. 8.

The terminal 33 includes a plurality of terminals 33a (33a1, 33a2, . . . , 33ak) arranged in the first direction X. The terminal 33ak located at one end in the first direction X is integrally formed with the second conductive layer CL.

The touch panel FPC 31 includes a plurality of terminals 31a (31a1, 32a2, . . . , 31ak) arranged in such a manner as to be opposed to the terminals 33a. The potential of the terminal 31ak located at one end in the first direction X is a reference potential (for example a ground potential).

The terminal 33 and the touch panel FPC 31 having the above-described structures are pressed against each other and attached to each other via an anisotropic conductive film ACF. Accordingly, the terminals 33a and the terminals 31a, which are arranged in such a manner as to be opposed to each other, are electrically connected to each other by a conductive material ACFC included in the anisotropic conductive film ACF. Therefore, the second conductive layer CL is electrically connected to the terminal 31ak and has a ground potential.

According to the present embodiment, the second conductive layer CL of a reference potential (for example a ground potential) is provided in a region covering the outer peripheral lines LTx and LRx. For example, as shown in FIG. 9, if electrostatic discharge occurs on the second main surface 10B, the noise current Ib capacitively-coupled with the second conductive layer CL via the substrate 10 and the first insulating film 11 is absorbed by the second conductive layer CL. Consequently, the noise current Ib is prevented from being capacitively-coupled with the outer peripheral lines LTx and LRx, and thus the noise current Ib is prevented from flowing into the outer peripheral lines LTx and LRx. As a result, electrical breakdown of the interelectrode insulating layer EI in the opposed portion OY1 can be prevented. In the third embodiment, the protection film PF may be omitted.

[Example of Application]

The detection method of the touch detection device (sensor) adopted in the above-described embodiments may be either a mutual-capacitive method or a self-capacitive method.

Figure 13:
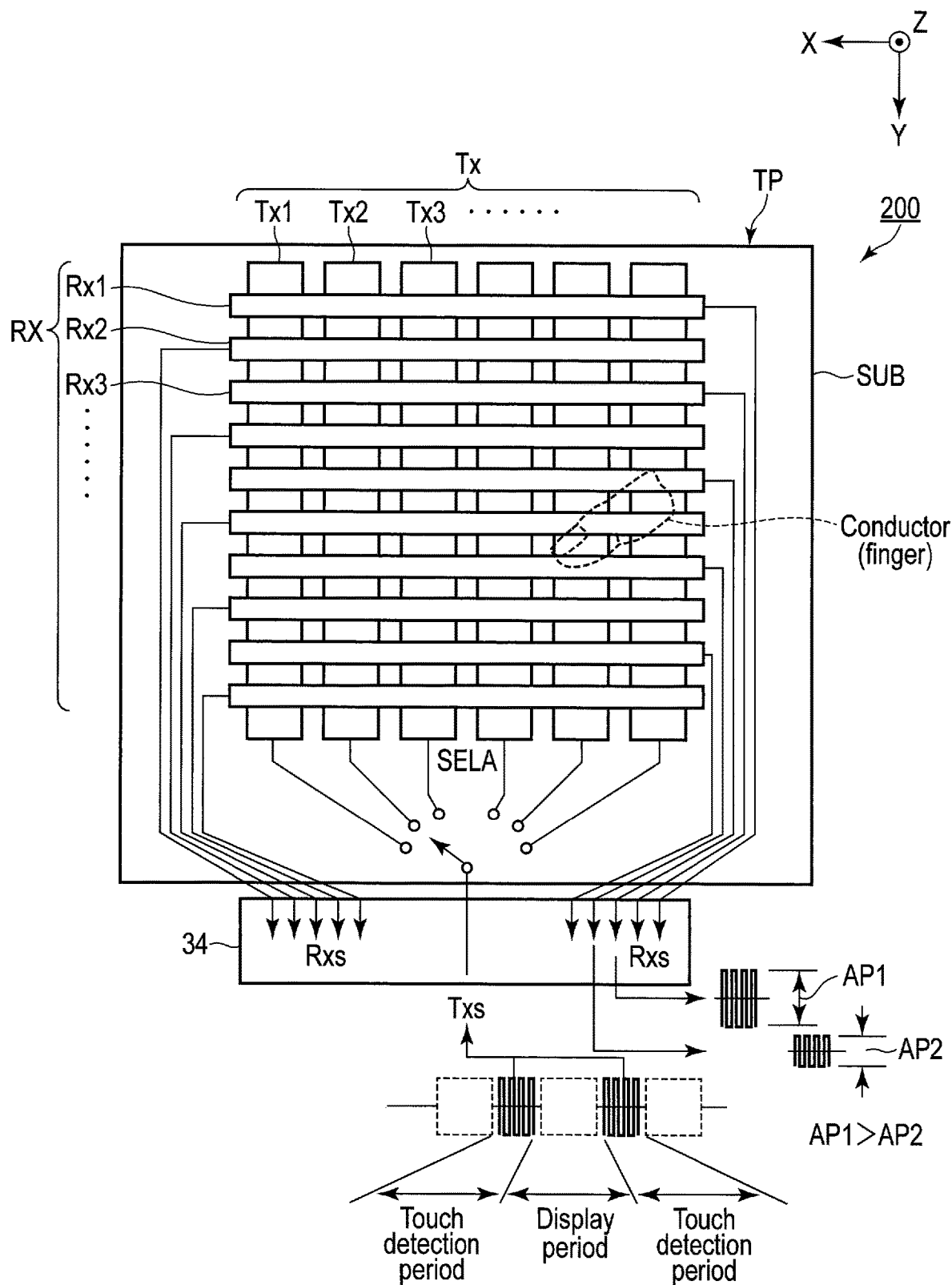
FIG. 13 is a plan view schematically showing a mutual-capacitive touch detection device applied to the display devices according to the first to third embodiments.

The basic structure of a mutual-capacitive touch detection device 200 is shown in FIG. 13. The touch detection device 200 includes the touch panel TP and the touch panel driver IC chip 34 for controlling the touch panel TP. In the mutual-capacitive method, a substrate SUB of the touch panel TP includes the second electrodes Tx (Tx1, Tx2, Tx3, . . . ) as drive electrodes, and the first electrodes Rx (Rx1, Rx2, Rx3, . . . ), which are insulated from the second electrodes Tx and arranged in such a manner as to cross the second electrodes Tx, as detection electrodes. The second electrodes Tx (Tx1, Tx2, Tx3, . . . ) elongated in the second direction Y (or the longitudinal direction) are arranged in parallel and at intervals in the first direction X (or the lateral direction). The first electrodes Rx (Rx1, Rx2, Rx3, . . . ) elongated in the first direction X are arranged in parallel and at intervals in the second direction Y. At the intersection of each second electrode Tx and each first electrode Rx, capacitance is formed between the opposed electrodes.

A common electrode which is provided with a constant potential in a display period in the display panel may be used as the above-described second electrode Tx. That is, in an in-cell display device, the second electrodes Tx (Tx1, Tx2, Tx3, . . . ) are used also as common electrodes for pixel circuits. In an on-cell display device, the above-described second electrodes Tx and first electrodes Rx are provided for a touch panel (touch detection substrate) designed for touch detection, as electrodes designed exclusively for touch detection. The above-described touch detection device 200 is controlled by the touch panel driver IC chip 34.

A touch detection period is distributed in one frame, for example. Therefore, in the display device, the display period and the touch detection period are time-shared. Further, a selector SELA sequentially supplies a pulsed drive signal Txs to the second electrodes Tx1, Tx2, Tx3, . . . in the touch detection period. If a user's finger contacts (touches) a position, the level of a detection signal Rxs output from the detection electrode Rx in the touch position becomes lower than the level of detection signals Rxs output from the other detection electrodes Rx. In the example illustrated, a case where the detection signal level of an electrode which does not detect any touch operation is AP1 and a case where the detection signal level of an electrode which detects a touch operation is AP2<AP1 are shown.

Although the mutual-capacitive method using the second electrode Tx and the first electrode Rx have been described above, the second electrode Tx and the first electrode Rx may also be used as the electrodes in the self-capacitive method. For example, the touch detection device 200 may operate as a self-capacitive touch detection device using only the second electrode Tx or may operate as a self-capacitive touch detection device using only the first electrode Rx. Such operations may be performed in a power-saving mode, for example.

Figure 14:
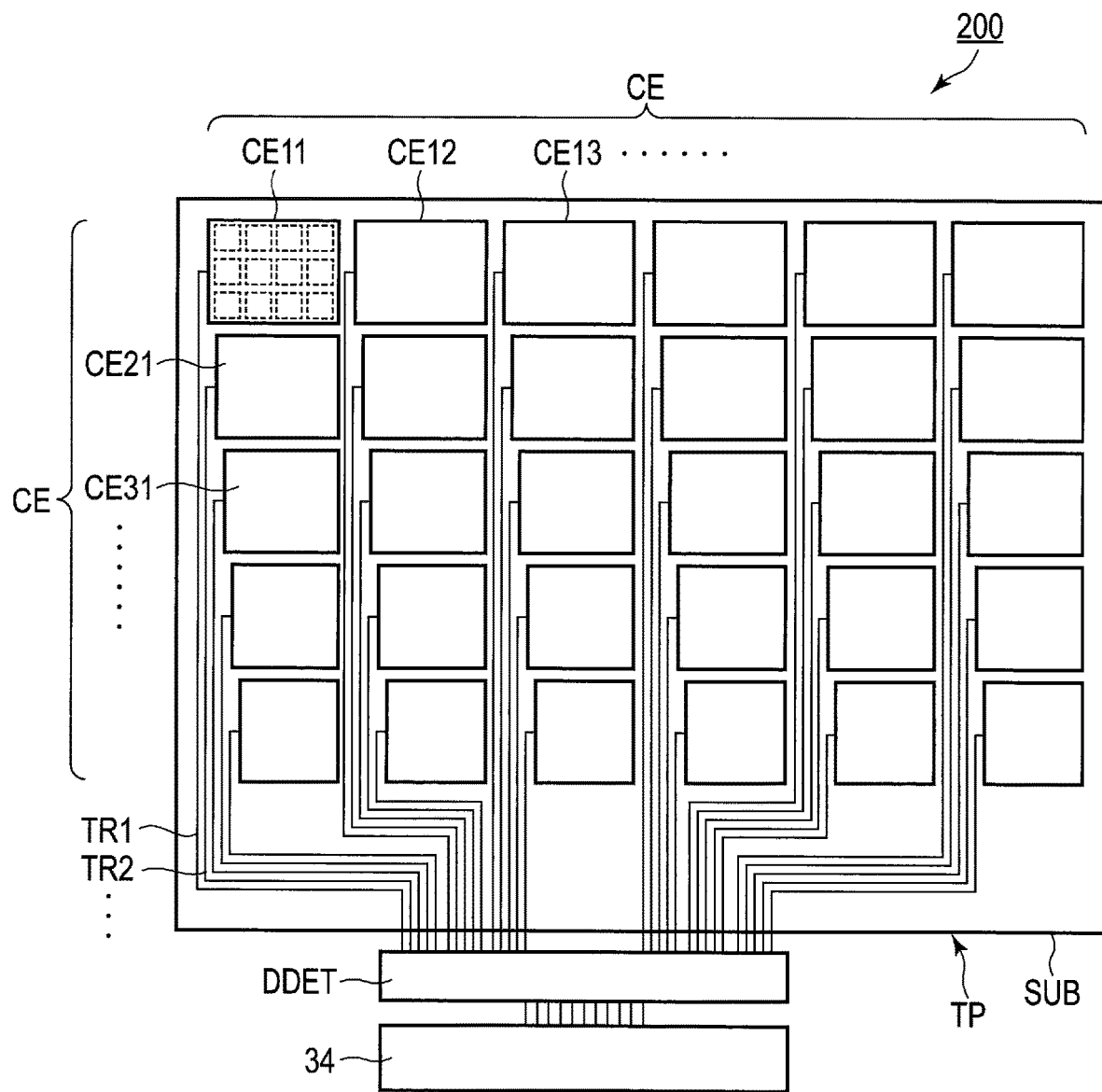
FIG. 14 is a plan view schematically showing a self-capacitive touch detection device applied to the display devices according to the first to third embodiments.

An example of the structure of the self-capacitive touch detection device 200 is shown in FIG. 14. The touch detection device 200 includes the touch panel TP, the touch panel driver IC chip 34 and a drive/detection circuit DDET. In the self-capacitive method, the substrate SUB of the touch panel TP includes, for example, a plurality of common electrodes CE (CE11, CE12, CE13, . . . , CE21, CE22, CE23, . . . , CE31, CE32, CE33, . . . ) arranged in a matrix and provided for detecting a touch operation. The common electrodes CE are connected respectively to outer peripheral lines TR (TR1, TR2, . . . ). The outer peripheral lines TR are electrically connected to the drive/detection circuit DDET. The drive/detection circuit DDET is formed in a non-display area of the first substrate (array substrate) SUB1 of a liquid crystal display panel LCD, for example. The drive/detection circuit DDET is controlled by the touch panel driver IC chip 34 (controller) and controls the touch detection function. The area of one common electrode CE is about 24 times the area of one pixel area, for example.

FIG. 15 shows a state where the common electrodes CE (CE11, CE21, CE31, . . . ) arranged in a line in the second direction Y of the self-capacitive touch detection device 200 shown in FIG. 14. The common electrodes CE are electrically connected to the touch panel driver IC chip 34 via the drive/detection circuit DDET. The drive/detection circuit DDET includes a first selector 501 which can select a common voltage Vcom, and a sensing circuit 520. Here, the common electrodes CE are assumed to include five common electrodes CE11, CE21, CE31, CE41 and CE51.

The outer peripheral lines TR1 to TR5 are guided to the drive/detection circuit DDET from the common electrodes CE11 to CE51, respectively. The drive/detection circuit DDET has the first selector 501 for applying the common voltage Vcom to all the common electrodes CE11 to CE51 in the display period. Further, the outer peripheral lines TR1 to TR5 are electrically connected to a second selector 522 in the sensing circuit 520 via the first selector 501.

Figure 16:
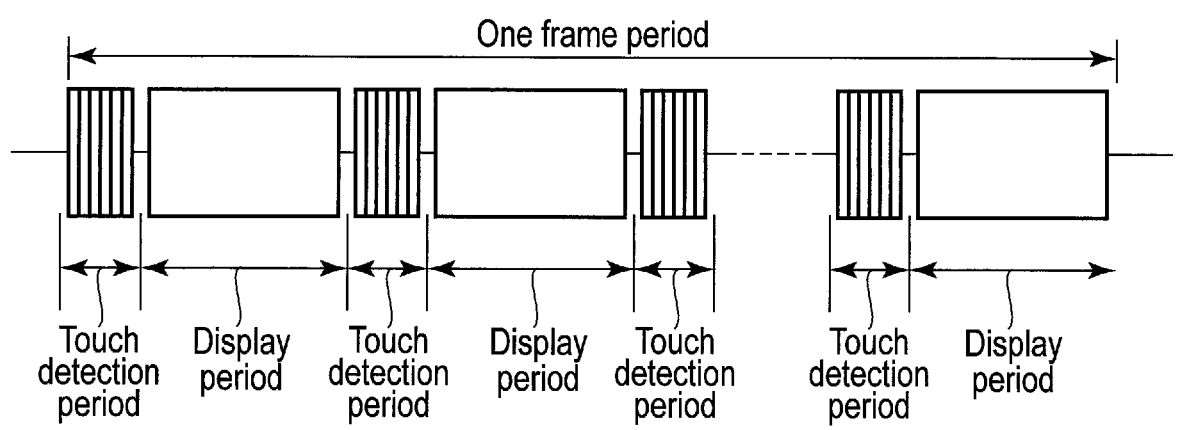
FIG. 16 is a timing chart of the touch detection device shown in FIG. 15.

The second selector 522 selects the outer peripheral lines TR1 to TR5 one by one and supplies a sensor signal to the outer peripheral lines TR1 to TR5. A period for supplying this sensor signal corresponds to the touch detection period shown in FIG. 16. In one frame, the display period is time-shared, and the touch detection period is set between the display periods.

The above-described sensor signal is generated in a sensor signal generator 524 and is input to the second selector 522 via a conversion circuit 523. Further, the sensor signal is also output to the output side of the conversion circuit 523, i.e., a detection circuit 530 side, as a detection signal. Here, it is assumed that a user's finger touches any of the common electrodes CE11 to CE51. In that case, when a sensor signal is supplied to the common electrode, the sensor signal is output from the conversion circuit 523 at a level different from another level (non-detection level) at a time when a user's finger does not touch the common electrode.

Although the structure of the conversion circuit 523 is not limited to any particular structure, for example, the conversion circuit 523 may be electrically connected to the common electrodes CE provided for detecting a touch operation by capacitive coupling. In this case, the common electrode CE is driven by a signal from the sensor signal generator 524 via capacitive coupling. As the detection circuit 530 measures the variable voltage level of this common electrode CE, presence or absence of a touch operation is detected. The capacitive component of the common electrode CE at a time when a finger contacts the common electrode CE is greater than the capacitive component of the common electrode CE at a time when a finger does not contact the common electrode CE. Therefore, the voltage variation of the common electrode CE at the time when a finger contacts the common electrode CE is narrower as compared to the voltage variation of the common electrode CE at the time when a finger does not contact the common electrode CE.

The detection circuit 530 includes a switch 531, an operational amplifier 532, a filter 533 and an A/D converter 534. The operational amplifier 532 may be connectable (connected in the touch detection period) to and disconnectable (disconnected in the display period) from the conversion circuit 523 by the switch 531 arranged at the previous step.

The operational amplifier 532 receives a sensor signal from the conversion circuit 523 and outputs a difference between this signal and a threshold value Vref. Further, a capacitor 535 and a switch 536 are connected in parallel to the operational amplifier 532. The output of the operational amplifier 532 is reset by setting the switch 536 to an on state in the display period, for example. The switch operations of the switch 531 and the switch 536 are performed based on control data from the touch panel driver IC chip 34, for example.

After a value is output from the operational amplifier 532, noise is removed from the value by the filter 533, and the value is converted to a digital signal by the A/D converter 534. This digital value is input to the touch panel driver IC chip 34 as touch detection data. The touch panel driver IC chip 34 performs arithmetic processing based on data from the sensing circuit 520 and identifies a touch position. The touch panel driver IC chip 34 has sequence control data for controlling the first selector 501, the second selector 522, the switch 531, etc. Therefore, when touch detection data is input from the detection circuit 530, the touch panel driver IC chip 34 can detect which common electrode the detection data comes from.

In the above description, the touch detection operation has been described with reference to the common electrodes CE11 to CE15 in the first line, but touch detection operations will be sequentially performed in the same manner with respect to the common electrodes in the second line, the third line, etc. In this case, the sensing circuit 520 may be sequentially used as a sensing circuit for each line. Alternatively, a sensing circuit may be provided exclusively for each line.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising
    a touch panel comprising a first substrate, a detection electrode located in a sensor area on the first substrate and outer peripheral lines provided in a peripheral area on the first substrate and electrically connected to the detection electrode;
    an insulating layer covering the detection electrode;
    a display panel;
    a protection film overlapping the outer peripheral lines;
    a polarizer disposed between the touch panel and the display panel; and
    an insulating material overlapping the detection electrode, contacting a surface of the insulation layer, a side surface of the protection film and a side surface of the polarizer, and not contacting the detection electrode,
    wherein the insulating material is provided under the detection electrode and between the protection film and the polarizer.

2. The display according to claim 1, further comprising
    an attachment layer attaching the touch panel and the polarizer in the sensor area, wherein
    the insulating material is formed of a material different from a material of the attachment layer.

3. The display device according to claim 2, wherein
    the insulating material contacts the attachment layer.

4. The display device according to claim 1, wherein
    the protection film has an opening portion opposed to the sensor area, and the detection electrode overlaps the opening portion.

5. The display device according to claim 4, wherein
    a thickness of the insulating material is greater than a thickness of the protection film in a thickness direction of the display device.

6. The display device according to claim 1, further comprising:
    an attachment layer attaching the touch panel and the polarizer in the sensor area, wherein
    the insulating material contacts the attachment layer.

7. The display device according to claim 1, further comprising:
    a black insulating layer provided between the first substrate and the outer peripheral lines.

8. The display device according to claim 1, wherein
    the insulating material has a shape of a ring overlapping an outermost periphery of the sensor area.

9. The display device according to claim 1, wherein
    the display panel comprises a second substrate, a third substrate, a liquid crystal located between the second substrate and the third substrate, and a conductive layer located between the second substrate and the polarizer, and
    the conductive layer has a ground potential.

10. The display device according to claim 1, further comprising
    an attachment layer attaching the touch panel and the polarizer, wherein
    the attachment layer is separated from the protection film, and
    the insulating material contacts a side surface of the attachment layer.

11. The display according to claim 10, wherein
    the protection film, the insulating material and the attachment layer are disposed on the insulating layer.

* * * * *